United States Patent [19]

Takigami et al.

[11] 4,392,175
[45] Jul. 5, 1983

[54] PROTECTING DEVICE FOR A GATE TURN-OFF THYRISTOR

[75] Inventors: Katsuhiko Takigami, Yokohama; Minami Takeuchi, Tokyo, both of Japan

[73] Assignee: Tokyo Shibaura Denki Kabushiki Kaisha, Saiwai, Japan

[21] Appl. No.: 212,244

[22] Filed: Dec. 2, 1980

[30] Foreign Application Priority Data

Dec. 10, 1979 [JP] Japan .................................. 54-160168
Dec. 10, 1979 [JP] Japan .................................. 54-160169

[51] Int. Cl.³ ............................................. H02H 3/20
[52] U.S. Cl. .................................... 361/88; 361/100; 307/252 C; 324/158 SC
[58] Field of Search ................... 361/86, 88, 100; 307/252 C, 252 M, 252 N; 324/158 SC, 158 T

[56] References Cited

U.S. PATENT DOCUMENTS

| | | | |
|---|---|---|---|
| 3,401,338 | 9/1968 | Bolvin | 361/100 X |
| 3,538,385 | 11/1970 | Obenhaus et al. | 361/100 X |
| 3,584,092 | 12/1974 | Tani et al. | 324/158 SC |
| 3,928,775 | 12/1975 | Steigerwald | 307/252 C |
| 4,231,083 | 10/1980 | Matsuda et al. | 307/252 C X |

FOREIGN PATENT DOCUMENTS

53-18255 5/1978 Japan .
53-33432 9/1978 Japan .
55-30238 3/1980 Japan .

OTHER PUBLICATIONS

Patents Abstracts of Japan, vol. 2, No. 133, Nov. 8, 1978, p. 8172E78 & JP—A—53—100758.
Patents Abstracts of Japan, vol. 2, No. 10, Jan. 25, 1978, p. 10299E77 & JP—A—52—125265.
Patents Abstracts of Japan, vol. 2, No. 102, Aug. 23, 1978, p. 5331E78 & JP—A—5368556 JP—A—5368557.

*Primary Examiner*—Reinhard J. Eisenzopf
*Attorney, Agent, or Firm*—Oblon, Fisher, Spivak, McClelland & Maier

[57] ABSTRACT

A protecting device includes a discriminating circuit and a protecting circuit. The GTO thyristor is operated in such a manner that a carrier storing is completed from a first time point at which the supply of a negative gate current is started to a second time point, an anode-cathode voltage increases from the second time point to a third time point and decreases from the third time point to a fourth time point, and increases again from the fourth time point. The discriminating circuit includes a circuit for obtaining an amount of change between the anode-cathode voltages at the third and fourth time points, a circuit for obtaining a ratio of the amount of change to the anode-cathode voltage at the third time point, and a comparing circuit for producing a control signal when the ratio is smaller than a given value. The protecting circuit, when receiving the control signal, stops the conduction of the GTO thyristor. It is judged whether or not the GTO thyristor is operated at a critical point to its break-down.

8 Claims, 32 Drawing Figures

Io : LOAD CURRENT
Ia : ANODE CURRENT

Is : SNUBBER CIRCUIT CURRENT

Va : ANODE - CATHODE VOLTAGE $V_L = L_S \dfrac{dIs}{dt}$

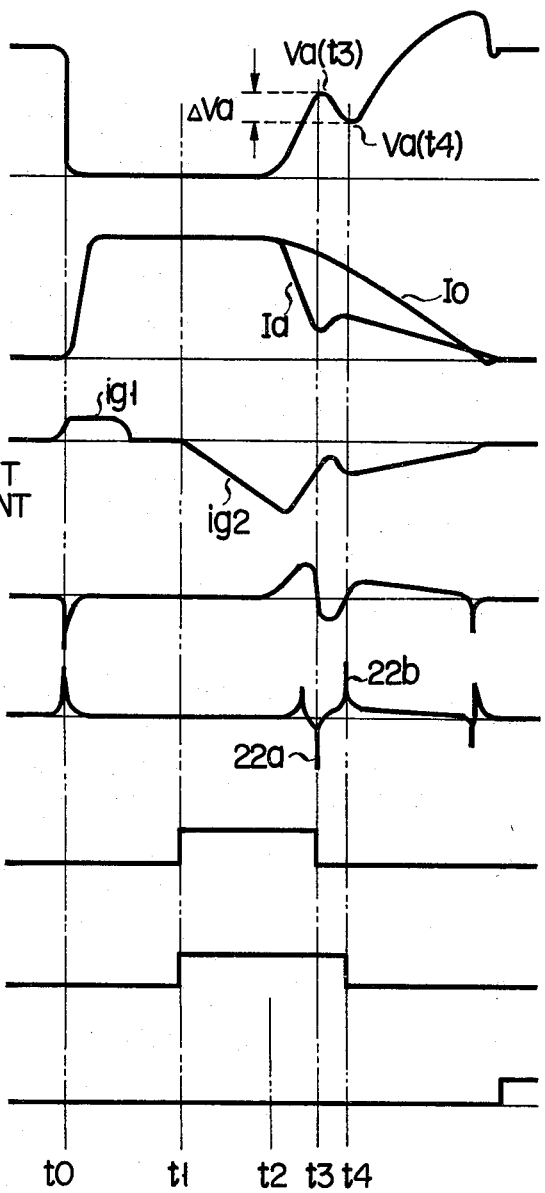

$Ia(t0) = ig_2 + ik_1 + ik_2 + ik_3$

PROTECTING DEVICE FOR A GATE TURN-OFF THYRISTOR

The present invention relates to a protecting device for a gate turn-off thyristor.

The gate turn-off (referred to as GTO) thyristor has been used as a non-contact switch in various electric circuits. The GTO thyristor is turned on when a positive gate current is fed to a gate-cathode path while is turned off when a negative gate current is fed to the same. The GTO thyristor is usually used being assembled into an electric circuit, as shown in FIG. 1. In FIG. 1, a GTO thyristor 3 is connected through a load 2 between the output terminals of a DC power source 1 with the polarity as shown. The output terminals of a gate current supply circuit 4 are connected between the gate C and the cathode K of the GTO thyristor 3. Upon receipt an ON signal X from exterior, the gate current supply circuit 4 supplies a positive gate current $i_{g1}$ to the GTO thyristor 3, as in an arrow direction, to turn on the GTO thyristor 3. When receiving an OFF signal Y from exterior, it suplies a negative gate current $i_{g2}$ to the GTO thyristor 3, as in an arrow direction, to turn-off the GTO thyristor 3. The GTO thyristor 3 is connected in parallel with a Snubber circuit 5 including a series circuit having a diode 6, connected as with the polarity, and a capacitor 7, a resistor 8 connected in parallel with the diode 6, the series circuit being connected across the GTO thyristor 3.

For well utilizing the GTO thyristor 3 as a switch, it is necessary to know the maximum value of the anode current capable of being turned off when the negative gate current $i_{g2}$ is supplied to the GTO thyristor 3. To measure the maximum turn-off anode current, the following method is used conventionally. A given number of GTO thyristors are sampled from those manufactured by the same manufacturing process. Those samples are subjected to be turned off and the anode currents when those samples are thermally broken down are measured. The anode currents measured are the maximum turn-off anode currents.

It is evident that the conventional method to measure the maximum turn-off anode current by breaking the GTO thyristors is not the best method. If possible, such measurement made without destroying the samples is desirable. The measurement made while it is assembled into a circuit is further desirable for the reason that the maximum turn-off anode current measured in the manufacturing step is frequently different from that when it is connected in an actual circuit. For ease of understanding the present invention, the turn-off mechanism of the GTO thyristor will be briefed. For turning off the GTO thyristor, a negative gate current is made to flow between the anode and the cathode. With the negative gate current flow, the anode current passage region between the anode and the cathode is gradually reduced in cross section and the anode current is concentrated in the region corresponding to substantially the center of the emitter region, finally resulting in the turn-off of the GTO thyristor. The usually employed methods to enhance the turn-off effect are to arrange narrow emitters in a radial fashion or to arrange a plurality of strip-like emitters, these methods each being called a multiemitter method.

Even in the multiemitter type GTO thyristor, it is inevitable that the turn-off characteristic of the emitters are not uniform, pressures between the emitter electrodes and the emitter regions are not the same with respect to the locations, with the result that excessive current flows into some of the emitters. The turn-off time of the emitter region allowing the excessive current to flow therethrough is elongated and finally the current is concentrated onto the emitter to be thermally broken down. Accordingly, the turn-off anode current of the GTO thyristor as a whole is considerably reduced. When some external cause reduces the negative gate current from the gate current supply circuit, the turn-off anode current falls remarkably below the measured turn-off anode current. If the GTO thyristor is used with the measured anode current, it is thermally broken down.

Accordingly, an object of the invention is to provide a protecting device for a GTO thyristor in which a specific index is obtained from a changing characteristic of the anode-cathode voltage or the anode current during the turn-off period of the GTO thyristor, it is checked whether or not the turn-off ability of the GTO thyristor approximates to the limit, and when the turn-off ability is close to the limit, the conduction of the GTO thyristor is automatically stopped.

In a protecting device for a GTO thyristor according to the present invention, the supply of a negative gate current to turning off an anode current of the GTO thyristor is commenced at a first time point. The anode current-passage region between the anode and cathode is shrinked from the first time point to a second time point. An electrical quantity representing one of the anode current and the anode-cathode voltage of the GTO thyristor is changed from the second time point in a first direction to complete the change at a third time point. The electrical quantity is changed from the third time point to a fourth time point at which a transient voltage developed by an inductance contained in a Snubber circuit connected to the GTO thyristor is reduced to substantially zero in a second direction opposite to the first direction. The electrical quantity is changed again in the first direction from the fourth time point. The protecting device is comprised of means for obtaining an amount of change of the electrical quantity between the third and fourth time points, means for obtaining a ratio of the change amount of the electrical quantity to an electrical quantity measured at a specific time point between a time point immediately before the first time point and the third time point, a discriminator including comparing means which comprises the ratio with a reference value preset and when the ratio is smaller than the reference value produces a control signal, and a protecting circuit for blocking the conduction of the GTO thyristor when it receives the control signal.

The protecting device is applicable for the judgement of the maximum turn-off anode current of the GTO thyristor at the manufacturing step and for the judgement of the maximum turn-off anode current of the GTO thyristor assembled into an actual circuit. When the protecting device is used, there is no need for destroying the GTO thyristor for measuring the maximum turn-off anode current. The specific index for judging whether or not the GTO thyristor is at a critical state to be broken down may be obtained from the anode-cathode voltage characteristic or the anode current characteristic during the turn-off operation of the GTO thyristor.

The present invention will be better understood when reading the following description in connection with the accompanying drawings, in which:

FIGS. 6A to 6H illustrate waveforms useful in explaining the operation of the circuit shown in FIG. 5;

Figure 1:
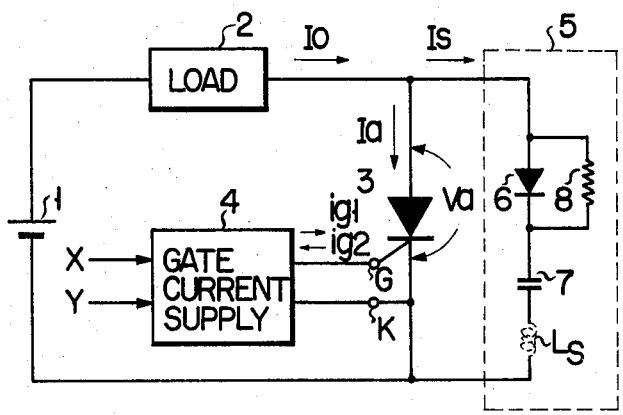
FIG. 1 is a circuit diagram of a conventional circuit with a GTO thyristor incorporated thereinto.
Figure 2A:
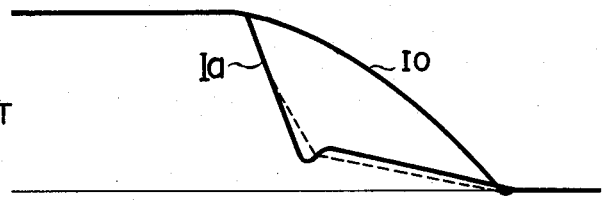
FIG. 2A–FIG. 2D are graphs of a set of waveforms for explaining the principle of the present invention.
Figure 2B:
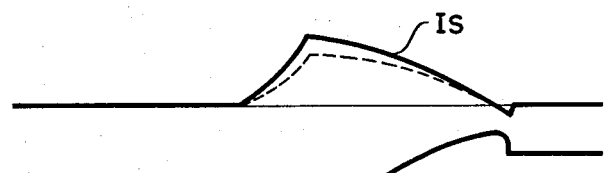
Figure 2C:
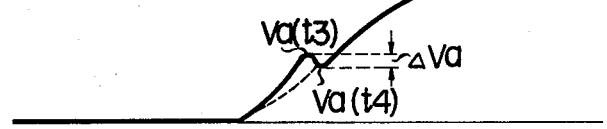
Figure 2D:
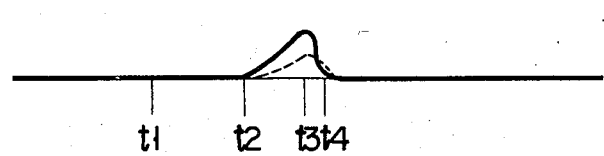

A first embodiment to obtain an index representing a critical state to the break-down of a GTO thyristor from a characteristic of the anode-cathode voltage will be described referring to FIG. 3 and FIGS. 6A to 6H. Before proceeding with a description of the embodiment of the invention, a characteristic of the general GTO thyristor will be described again, with reference to FIGS. 1 and 2. In the turn-on state of the GTO thyristor as a result of the supply of the ON signal X to the gate current supply circuit 4, an OFF signal Y is applied to the gate current supply circuit 4 at a first time point t1 which in turn starts to supply a negative gate current $i_{g2}$ to the gate G. Under this condition, a load current Io, a Snubber circuit current Is and an anode-cathode voltage Va take waveforms as indicated by seal lines in FIGS. 2A to 2C. An inductance component contained in the Snubber circuit 5 in FIG. 1 is denoted as Ls. As shown, the anode current Ia decreases from a second time point t2 at which the storage of the carrier of the GTO thyristor is completed and during the course of increase of the Snubber circuit current Is, a voltage $V_L = Ls \times dIs/dt$ is induced across the inductance Ls, as shown in FIG. 2D. The induced voltage $V_L$ is superposed on the anode-cathode voltage Va increasing from the second time point t2. Accordingly, a spike voltage denoted as Va(t3) (FIG. 2C) necessarily appears in the anode-cathode voltage Va at a third time point t3. As the induced voltage Va decreases from the third time point t3, the anode-cathode voltage Va gradually decreases to be Va(t4) at a fourth time point t4. From the fourth time point, the anode-cathode voltage increases again. As a result of the study of the waveforms shown in FIGS. 2A to 2D by the inventors, it was found that the ratio M of the difference ΔVa between the anode-cathode voltage Va(t3) at the third time point t3 and the anode-cathode voltage Va(t4) at the fourth time point t4 to the anode-cathode voltage Va(t3) at the third time point t3 is used as an index to anticipate the break-down of the GTO thyristor.

Figure 3:
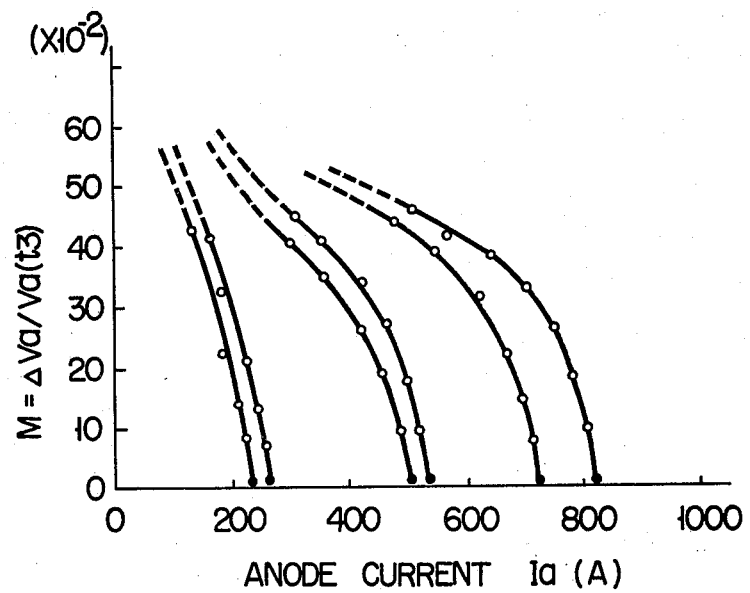
FIG. 3 illustrates characteristic curves for illustrating the principle of the present invention.

Three groups of the GTO thyristors having, respectively, large, middle and small maximum turn-off anode currents are selected and two of each group were measured about the relation of the anode current Ia to the ratio M. The measurement result was as shown in FIG. 3. In FIG. 3, white dots indicate a case where the turn-off of the GTO thyristors succeeded by the corresponding anode current Ia, while black dots indicates a case where the turn-off failed, resulting in the break-down of the GTO thyristors by the anode currents. In this experiment, the inductance component Ls was 2 μH. The experiment showed that in the GTO thyristor with any withstanding quantity, as the anode current Ia increases, the index M decreases and when the index M approximates to zero, the GTO thyristor is broken down. Various experiments other than the above showed the same fact. When the turn-off characteristic of the GTO thyristor has a non-uniform distribution over a conduction region of the GTO thyristor or when the anode current to be turned off is larger, variation of the turn-off times of the emitters is increased even if the turn-off characteristics of the emitters are slightly different from one another. In this case, the anode current concentrates into the emitter with the longest turn-off time. However, so long as the emitter is not broken down by the concentrated current flowing therethrough, the GTO thyristor succeeds in the turn-off. The waveforms when the GTO thyristor succeeds in the turn-off under this condition, is as indicated by dotted lines in FIGS. 2A to 2D. The decrease of the difference ΔVa shown in FIG. 2C indicates that the anode current concentrates into a specific emitter. The excessive concentration of the anode current breaks down the GTO thyristor. Since the difference ΔVa depends on the anode current Ia and the anode-cathode voltage Va, the break-down of the GTO thyristor may be anticipated by detecting and checking the ratio M of the ΔVa shown in FIG. 2C to the anode-cathode voltage Va(t3) at the third time point t3. Accordingly, in this way, it is possible to know the maximum turn-off anode current of the GTO thyristor and also to check whether or not the GTO thyristor is in a critical state to the break-down of the GTO thyristor. In other words, a maximum anode current can easily be anticipated and the state in which a GTO thyristor is operated at a critical state being broken down.

Figure 4:
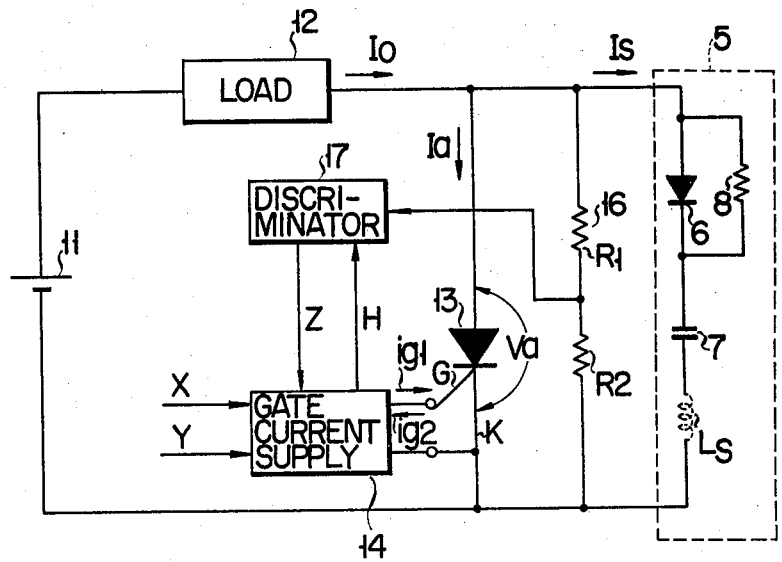
FIG. 4 is a block diagram of an embodiment of a protecting device for a GTO thyristor according to the present invention.

An example when the GTO thyristor is assembled into an actual circuit will be described referring to FIGS. 4 to 6. In FIG. 4, reference numeral 11 designates a DC power source; 12 a load; 13 a GTO thyristor; 5 a Snubber circuit having the components as shown in FIG. 1; 14 a gate current supply circuit. The connection of those components has been described referring to FIG. 1. No further description will therefore be given. The circuit arrangement of the present example has additionally a voltage-dividing circuit 16 including resistors R1 and R2 connected in parallel with the GTO thyristor 13, and discriminating circuit 17.

The discriminating circuit 17 receives the voltage at the voltage dividing point of the voltage-divider 16 and applies a control signal Z to the gate signal supply circuit 14 while receives a signal H from the gate signal supply circuit 14. The signals Z and H will be described later referring to FIG. 5.

Figure 5:
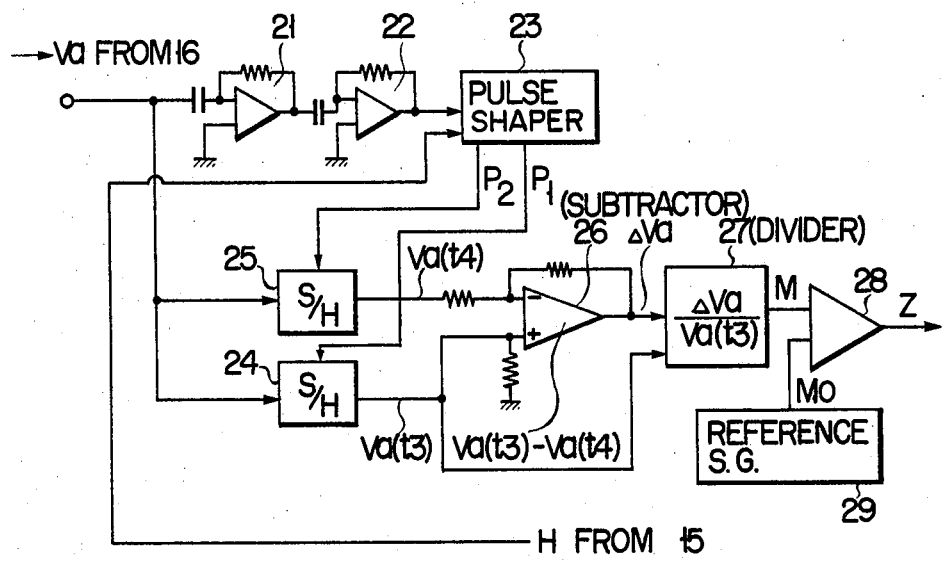
FIG. 5 is a circuit diagram of a detailed discriminating circuit used in FIG. 4.

As shown in FIG. 5, the anode-cathode voltage Va outputted from the voltage-divider 16 is applied to a pulse shaping circuit 23, through differential circuits 21 and 22 which are arranged in series fashion. For simplicity, Va representing the anode-cathode voltage of the GTO thyristor 13 is used for designating the anode-cathode voltage from the voltage-divider 16. The voltage Va is also introduced into first and second sample hold circuits 24 and 25. The pulse shaping circuit 23 also receives a signal H produced at a time point that the supply of the negative gate current $i_{g2}$ to the gate G of the GTO thyristor starts in response to the supply of the OFF signal Y to the gate current supply circuit 14. The pulse shaping circuit 23 applies a first pulse P1 to the first sample hold circuit 24 and applies a second pulse P2 to the second sample hold circuit 25. The first pulse P1 rises when the signal H is applied to the circuit 23 and falls when the differential circuit 22 produces a negative pulse. The second pulse P2 rises when the signal H is introduced into the circuit 23 and falls when a positive pulse is outputted succeeding to the above mentioned negative pulse from the differential circuit 22. The sample hold circuits 24 and 25 sequentially receive input signals during a period that the internal gates are open and store sample values immediately before the gates are closed. The pulse P1 is used as a gate opening signal of the sample hold circuit 24, while the pulse P2 is used as a gate opening signal of the sample hold circuit 25. The output signal from the first sample hold circuit 24 is applied to a positive input terminal of a subtraction circuit 26. The output signal from the second sample hold circuit 25 is applied to a negative input terminal of the subtraction circuit 26. The subtraction circuit 26 subtracts the output Va(t4) of the second sample hold circuit 25 from the output Va(t3) of first sample hold circuit 24, and applies the result of the subtraction to one of the input terminals of a divider circuit 27. The output signal Va(t3) of the first sample hold circuit 24 is applied to the other input terminal of the divider circuit 27. The divider circuit 27 computes the ratio M $(=\Delta Va/Va(t3))$ of the $\Delta Va$ to the Va(t3) and applies the result of the computation to one of the input terminals of a comparator 28. A reference signal Mo is applied to the other input terminal of the comparator 28. The comparator 28 produces the control signal Z when the level of the input signal M is lower than the level of the input signal Mo. When receiving the control signal Z, the gate current supply circuit 14 stops the feeding of the positive gate current $i_{g1}$ to stop the conduction of the GTO thyristor 13.

The operation of the circuit shown in FIG. 5 will be described with reference to FIG. 6. At time point t0, the ON signal X is applied to the gate signal supply circuit 14. Upon receipt of the signal X, the circuit 14 applies the positive gate current $i_{g1}$ to the gate G (FIG. 6C). The load current Io rises from the time point t0 (FIG. 6B). At a first time point t1, the OFF signal Y is supplied to the gate signal supply circuit 14, so that the circuit 14 starts to supply the negative gate current $i_{g2}$ to the gate G (FIG. 6C). At the first time point t1, the signal H is supplied to the pulse shaping circuit 23. As a result the circuit 23 produces the pulses P1 and P2 to enable the gates of the first and second sample hold circuits 24 and 25 (FIGS. 6F and 6G). That is, when the negative gate current $i_{g2}$ is supplied between the gate and cathode terminals of the GTO thyristor (FIG. 6C). At this time, the GTO thyristor 13 starts the turn-off operation. At the time point t2 in the falling period (t2 to t3) following the carrier storing period (t1 to t2), the anode current Ia starts its decrease. With the decrease of the anode current, the current Is (FIG. 4) flows into the Snubber circuit 5 to induce a voltage $V_L = Ls \times dIs/dt$ across the inductance component Ls in the Snubber circuit (FIG. 2D). Substantially at the same time that the anode current Ia starts to decrease, the anode-cathode voltage Va rises (FIG. 6A). Actually, the anode-cathode voltage Va is the superposition of the induced voltage $V_L$ on a voltage restoration characteristic determined by the main circuit. At the third time point t3 that the falling period terminates, the induced voltage $V_L$ reaches its peak (FIG. 2D), so that the anode-cathode voltage Va starts to decrease. At this time, the output signal from the differential circuit 21 is suddenly inverted (FIG. 6D) and therefore the differential circuit 22 produces a negative pulse 22a (FIG. 6E). When the negative pulse 22a is produced from the differential circuit 22, the first output pulse P1 from the pulse shaping circuit 23 falls. As a result, the gate of the first sample hold circuit 24 is disabled to hold the anode-cathode voltage Va(t3) at the third time point t3. Since the induced voltage $V_L$ falls from the third to fourth time points (t3 to t4), the anode-cathode voltage rises again from the time point t4 with the time constant determined by constants of the circuit (FIG. 6A). When the anode-cathode voltage Va rises again, the output of the differential circuit 21 suddenly inverted from negative to positive at time point t4 (FIG. 6D). Accordingly, at the fourth time point, the differential circuit 22 produces a positive pulse 22b. As a result, the second output pulse P2 from the pulse shaping circuit 23 falls and disable the gate of the second sample hold circuit 25 (FIG. 6G). Accordingly, the circuit 25 holds the anode-cathode voltage Va(t4) at the fourth time point t4 and produces it. The subtraction circuit 26 calculates a difference $\Delta Va$ between the output signals from the circuits 24 and 25, $\Delta Va = Va(t3) - Va(t4)$. The divider circuit 27 receives the output $\Delta Va$ from the subtraction circuit 26 and the output signal Va(t3) from the circuit 24 to compute $\Delta Va/Va(t3) = M$. The reference signal circuit 29 produces a reference signal Mo. The comparing circuit 28 compares the output signal M from the divider circuit 27 with the reference signal Mo. When the M is smaller than Mo, it produces the control signal Z (FIG. 6H). The Mo is selected $20 \times 10^{-2}$, for example, on the ordinate of the graph shown in FIG. 3, by considering the inductance component Ls of the Snubber circuit 5. When M is less than Mo, that is, when the operation of the GTO thyristor 13 is in approximation with its turn-off ability, the control signal Z is produced from the comparator 28. The gate signal supply circuit 14 stops the supply of the positive gate current $i_{g1}$ to the gate G, for example, when receiving the control signal Z. Therefore, even when the GTO thyristor is operated under a condition that the turn-off ability of the GTO thyristor gradually degrades due to some external cause, it is possible to stop the operation of the GTO thyristor or to tell the need of an inspection about the GTO thyristor before the break-down of the GTO thyristor, by properly selecting the value of the reference signal Mo.

The embodiment as mentioned above is an example when the protecting device is assembled into the actual circuit, as mentioned above. It should be understood that the present invention is applicable for a test circuit for measuring the maximum turn-off anode current of the GTO thyristor manufactured. The test circuit using the protecting circuit of the present invention can obtain the maximum turn-off anode current of the GTO thyristor with a relatively high precision and a high efficiency. When a plurality of GTO thyristors are used in a bridge connection, the voltage ratio M of each of the GTO thyristors is measured and when the voltage ratio M is smaller than the reference Mo, the control signal Z is applied to the gate current supply circuit of each GTO thyristor to stop the turn-on of all of the GTO thyristors. In this case, the DC power supply to those GTO thyristors may be shut off, alternatively. The discriminating circuit is not limited to the construction shown in FIG. 5 but may be any construction if it allows the computation of the M and the comparison of the M with Mo. The control signal Z may be used to operate the display device and the alarm device. When the rated value of the GTO thyristor is set to a fixed value, the discriminating circuit may be constructed such that when $\Delta Va < \Delta Vo$ with the $\Delta Vo$ as a reference value, it produces the control signal Z. The construction is allowed for the following reason: Since the $\Delta Va$ may be used as an index to anticipate the break-down of the GTO thyristor, the $\Delta Vo$ may be used as the reference value without obtaining the ratio M.

Figure 7:
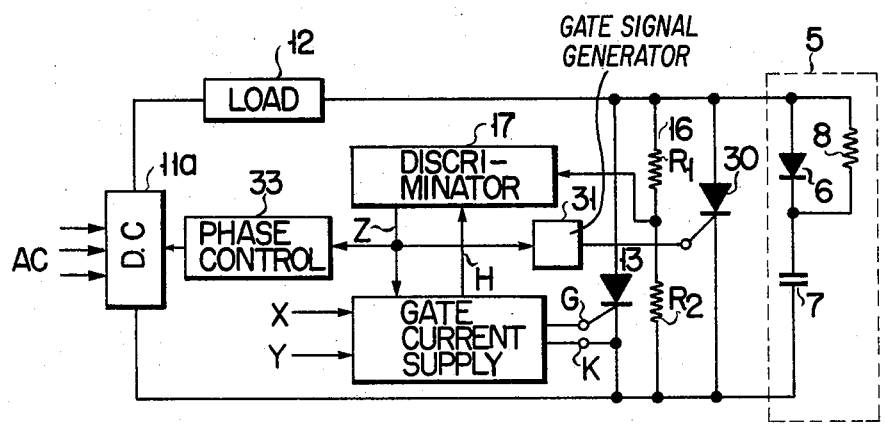
FIG. 7 illustrates, by way of block and schematic circuit diagram, of a modification of an embodiment shown in FIG. 4.

A modification of the means for protecting the GTO thyristor 13 when it receives the control signal Z from the discriminating circuit 17 will be described referring to FIG. 7. In FIG. 7, like reference numerals designate like or equivalent portions in FIG. 4. The power source 11a includes a plurality of thyristors for rectifying an input AC voltage and a capacitor for smoothing the rectified pulsate wave (those components for rectifying and smoothing are both not illustrated). A thyristor 30 is connected in parallel with the GTO thyristor 13 with the same polarity as that of the GTO thyristor. The control signal Z as the output signal from the discriminating circuit 17 is applied to the gate signal generating circuit 31. When receiving the signal Z, a positive gate current is supplied to the gate of the thyristor 30 to turn on the GTO thyristor. The control signal Z is supplied to a phase control circuit 33. When receiving the control signal Z, the phase control circuit 33 controls the phases of the gate signals of the thyristors constituting a DC power source 11a to reduce the output thereof to zero. The reason why the thyristor 30 is provided is that the charge stored in the capacitor provided in the DC power source circuit 11a is rapidly discharged simultaneously with the generation of the control signal generation to further enhance the protection of the GTO thyristor 13 by the gate signal generation circuit 14. Besides the modification shown in FIG. 7, a switch may be connected in series with the GTO thyristor 13 and may be turned off by the control signal Z.

In the embodiments shown in FIGS. 4 to 5, the index M was obtained as the ratio of the variation $\Delta Va$ in the voltage between the anode-cathode voltage over a period from the third time point t3 to the fourth time point t4 to the anode-cathode voltage Va(t3) at the third time point t3. An index Ma corresponding to the index M may be obtained from the anode current. A second embodiment of the protecting circuit for the GTO thyristor using the index Ma will be described in detail referring to FIGS. 8 and 9, FIGS. 10A to 10H and FIG. 11.

Figure 8:
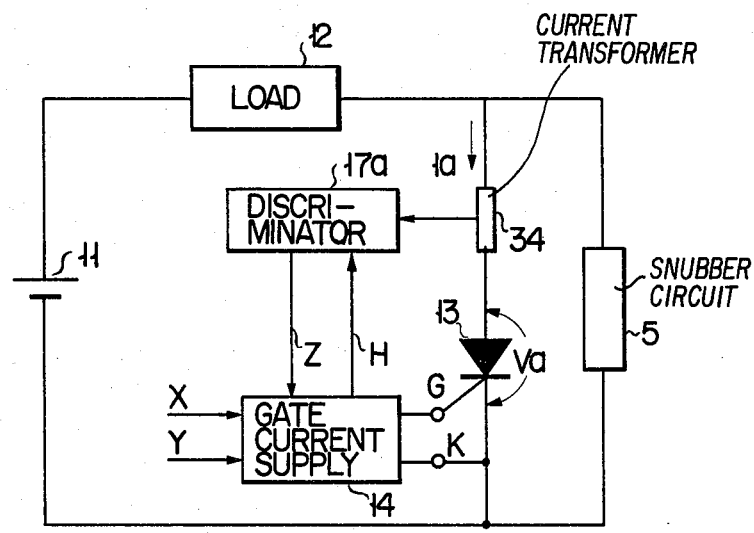
FIG. 8 illustrates, by way of block and schematic circuit diagrams, a second embodiment of a protecting device for a GTO thyristor according to the present invention.
Figure 9:
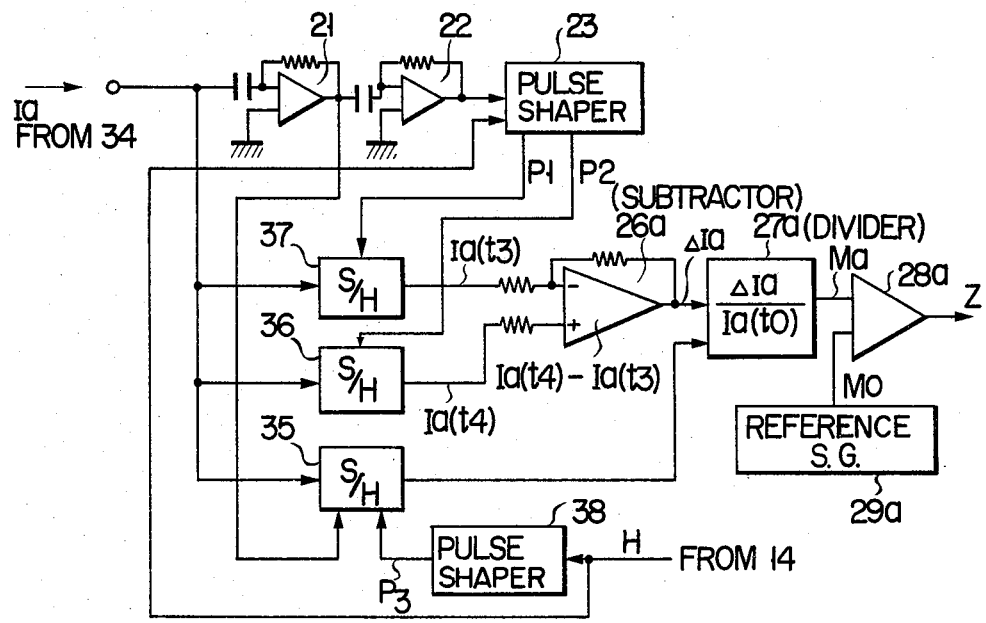
FIG. 9 is a circuit diagram of a detailed discriminating circuit shown in FIG. 8.

In FIG. 8, like reference numerals are used to designate like or equivalent portions shown in FIG. 4. A current transformer 34 for detecting the anode current Ia of the GTO thyristor 13 is connected in series with the GTO thyristor 13 and supplies its output to a discriminating circuit 17a. The detail of the Snubber circuit 5 is shown in FIG. 4. The detail of the discriminating circuit 17a is shown in FIG. 9. For simplicity, the reference symbol Ia is used for designating the output signal from the current transformer 34. The denotation raises no problem since the primary current of the current transformer 34 is analogous to the secondary current. In FIG. 9, the output current Ia of the current transformer 34 is applied through the differential circuits 21 and 22, which are arranged in series, to the first input terminal of a pulse shaping circuit 23. The output Ia is further applied to the input terminals of first to third sample hold circuits 35 to 37. The gate current supply circuit 14 supplies an output signal to the second input terminal of the first pulse shaping circuit 23 when it supplies the negative gate current $i_{g2}$ to the gate G of the GTO thyristor. At the time that the circuit 23 receives the signal H, the circuit 23 sends forth a pulse P1 which falls by a positive pulse outputted from the differential circuit to the third sample hold circuit 37. The circuit 23 also supplies to the second sample hold circuit 36 a pulse P2 which falls by a negative pulse derived from the differential circuit 22 when the signal H is introduced into the circuit 23. The pulse P1 enables the gate of the third sample hold circuit 37 and the pulse P2 enables the gate of the second sample hold circuit 36. In the first sample hold circuit 35, the gate is enabled by the positive pulse outputted from the differential circuit 21 and the gate is disabled by a pulse P3 produced from a pulse shaping circuit 38 when the second pulse shaping circuit 38 is supplied with the signal H. The pulse P3 has an extremely narrow pulse width. The output signal from the second sample hold circuit 36 is applied to the positive input terminal of the subtractor circuit 26a. The output from the third sample hold circuit 37 is supplied to a negative input terminal of the subtractor circuit 26a. A difference between the input signals derived from the subtractor circuit 26a is applied to a divider circuit 27a. The divider circuit 27a computes a ratio Ma of the difference signal $\Delta Ia$ to the output signal Ia(t0) from the first sample hold circuit 35. The ratio Ma is supplied to the first input of a comparator 28a. A reference signal Mo from a reference signal generating circuit 29a is applied to the second input of the comparator 28a. The comparator 28a applies a control signal Z to the gate signal supply circuit 14 when Ma<Mo is satisfied. The gate signal supply circuit 14, when receiving the control signal, stops the supply of a positive gate current $i_{g1}$ to the gate G.

Figure 10:
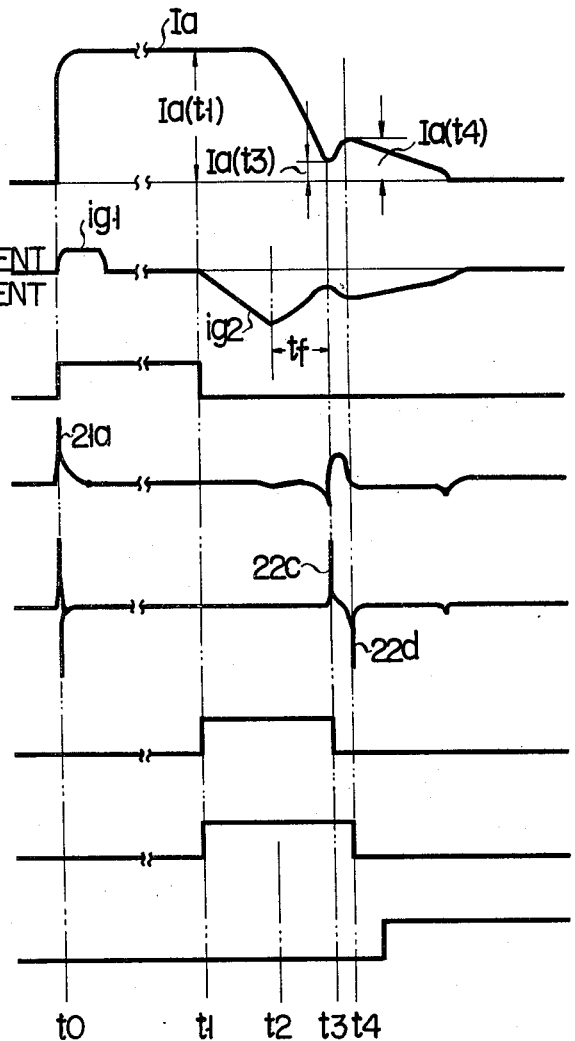
FIGS. 10A to 10H are waveforms for diagrammatically illustrating the operation of the circuit shown in FIG. 9.

The operation of the discriminating circuit shown in FIG. 9 will be described referring to FIGS. 10A to 10H. When an ON signal X is supplied to the gate signal supply circuit 14 at a time point t0, the circuit 14 supplies a positive gate current $i_{g1}$ to the gate G (FIG. 10B). As a result, the GTO thyristor 13 is turned on and the anode current Ia rises (FIG. 10A). When the anode current rises, a positive pulse 21a is produced from the differential circuit 21 at the time point t0 (FIG. 10D). The pulse 21a enables the gate of the first sample hold circuit 35 (FIG. 10C). Then, when an OFF signal Y is applied to the gate current supply circuit 14 at a time point t1, the supply of the negative gate current $i_{g2}$ to the gate G starts. At the same time, the signal H is supplied to the first and second pulse shaping circuits 23 and 38. As a result, the gate of the first sample hold circuit 25 is enabled by the pulse P3 from the second pulse shaping circuit 38 (FIG. 10C) and the anode current Ia at the time point t1 is held by the circuit 35. Since the signal H is also applied to the first pulse shaping circuit 23 at the time point t1, the circuit 23 produces the pulses P1 and P2. As a result, the gates of the second and third sample hold circuits 36 and 37 are enabled (FIGS. 10F and 10G). From the second time point t2 at which the carrier storage is completed, the anode current Ia decreases to reach a minimum value Ia(t3) at a third time point t3 where the decreasing period $t_f$ terminates. At the third time point t3, a displacement current $i_d$ starts to flow into a capacitor Cj formed by the center junction of the GTO thyristor (those Cj and $i_d$ are not shown), so that the anode current Ia starts to increase from the time point t3. Accordingly, the output from the differential circuit 21 starts the inversion at the time point t3 (FIG. 10D). For this reason, a positive pulse 22c is produced from the differential circuit 22 at the third time point t3. As a result of the outputting of the pulse 22c, the first pulse P1 derived from the pulse shaping circuit 23 falls, the gate of the third sample hold circuit 37 is closed (FIG. 10F), and the anode current Ia(t3) at the third time point t3 is held by the circuit 37. Then, the displacement current $I_d$ (not shown) is superposed on the anode current. Hence, the anode current starts to increase from the third time point t3 while the displacement current $i_d$ decreases from the fourth time point t4. The anode current when it starts the decrease is denoted as Ia(t4) (FIG. 10A). When the anode current starts to decrease at the fourth time pint t4, the output signal from the differential circuit 21 is inverted (FIG. 10D). Accordingly, at the fourth time point t4, a negative pulse 22d is produced from the differential circuit 22 at the time point t4. Therefore, the second output pulse P2 from the circuit 23 falls, so that the gate of the second sample hold circuit 36 is disabled and the anode current Ia(t4) is held at the fourth time point t4. Since the outputs from the sample hold circuits 36 and 37 are subjected to the subtraction in the subtraction circuit 26a, the circuit 26a produces an output $\Delta$Ia=Ia(t4)−Ia(t3). The divider circuit 27a performs Ma=$\Delta$Ia/Ia(t0) and applies the Ma to one of the input terminals of the comparator 28a. The comparator 28a compares the input Ma with the reference signal Mo and produces a control signal Z when Ma<Mo. The control signal Z is supplied to the gate current supply circuit 14 which in turn stops the supply of the positive gate current $i_{g1}$, as described referring to FIG. 4.

Figure 11:
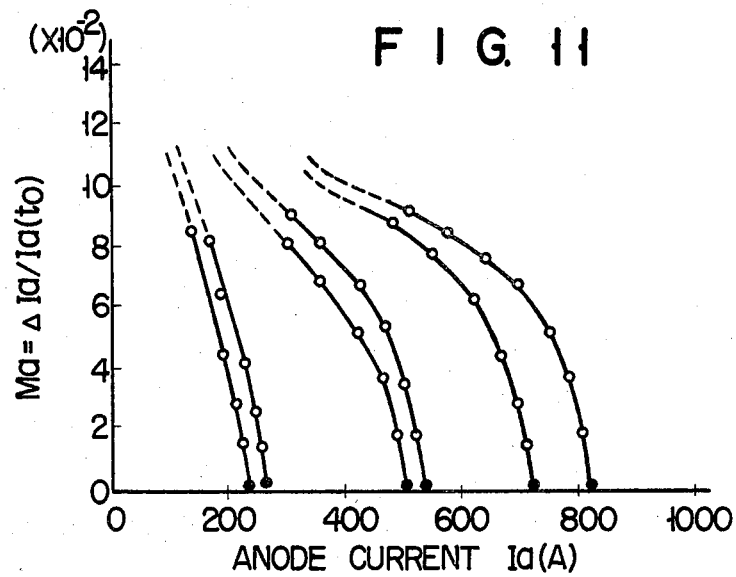
FIG. 11 is a graphical representation of characteristic curves for illustrating the principle of the embodiment shown in FIG. 8.

A relation between the index Ma to the anode current Ia is illustrated in FIG. 11. In FIG. 11, three couples of GTO thyristors with large, middle and low turn-off currents are selected and measured about the relation. White dots indicate a case where the GTO thyristors succeeded in the turning off the corresponding anode currents. Black dots indicate a case where the GTO thyristors are broken down by the corresponding anode currents.

Figure 12:
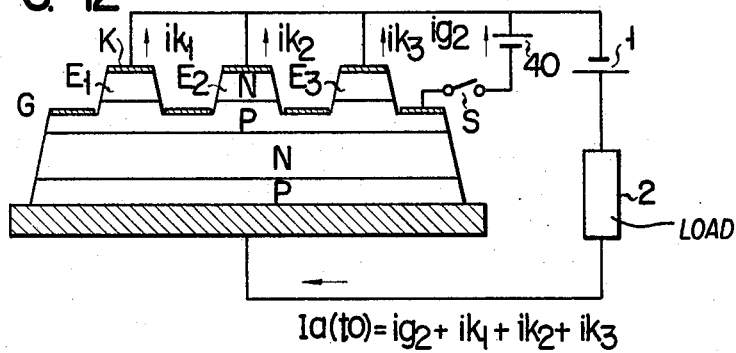
FIG. 12 illustrates in cross section a GTO thyristor for analyzing the operation of the GTO thyristor contained in the circuit shown in FIG. 8, together with its connection.
Figure 13:
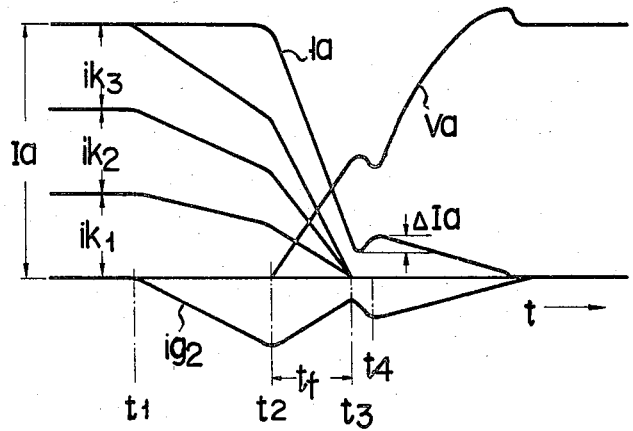
FIGS. 13 and 14 are waveforms at the respective portions of the GTO thyristor when it is operated.
Figure 14:
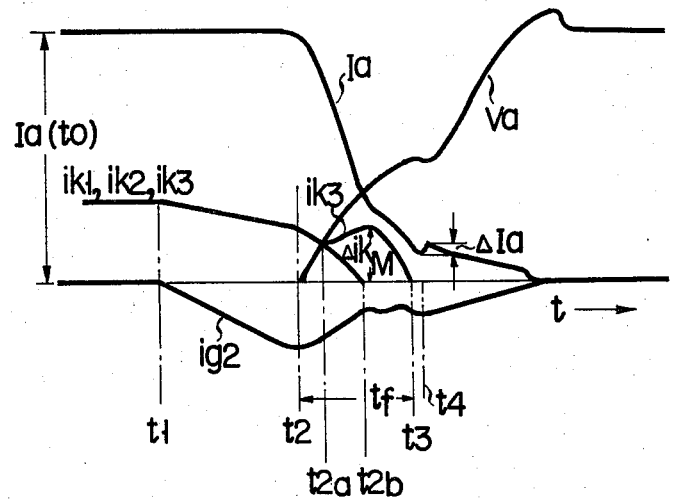

The phenomenon where the GTO thyristor is broken down when the index Ma approximates to zero, may be interpreted as in the following. Let us consider the anode current and anode-cathode voltage of a GTO thyristor with three emitter regions $E_1$ to $E_3$ shown in FIG. 12. For simplicity, like symbols are used for indicating like or equivalent portions in FIG. 1. In the figure, S designates a switch; $iK_1$ to $iK_3$ cathode currents flowing through the respective emitters $E_1$ to $E_3$. When the current Ia=$iK_1$+$iK_2$+$iK_3$ is flowing, the switch S is turned on at the time point t=t1 to start the supply of the negative gate current $i_{g2}$. Then, the anode current Ia at time after the time point t1 and the anode-cathode voltage Va change, as shown in FIG. 13. FIG. 13 illustrates an ideal case where the anode currents are uniformly distributed over the respective emitters. The waveforms as shown in FIG. 13 are obtained when the GTO thyristor is operated with the anode current much smaller than the maximum turn-off anode current. However, the turn-off characteristics are frequently non-uniformly distributed over the respective emitter regions. In such a case of non-uniform distribution of the turn-off characteristics, the times for turning off in the respective emitter regions greatly varies when the anode current to make the turn-off the GTO thyristor becomes large even if the turn-off characteristics among the emitters are slightly different from one another. In FIG. 12, for example, when the turn-off time of the emitter region $E_3$ is longer than those of the remaining emitter regions $E_1$ and $E_2$, the waveforms at the respective portions of the GTO thyristor at the time of the turn-off as shown in FIG. 14. After the time point t1 of the start of the flow of the negative gate current $i_{g2}$, at the time point t2 that the carrier storage is completed, the squeeze or contraction of the current passage region for the anode current is completed. From the time point t2, the anode currents $iK_1$ and $iK_2$ rapidly decrease. With this, the current share of the emitter region $E_3$ increases. When the anode currents flowing through the emitter regions $E_1$ and $E_2$ become zero at a time point $t2_b$, the anode current $iK_3$ shared by the emitter region $E_3$ reaches a maximum value $\Delta iK_M$ at the time point $t2_b$. Even when the maximum value $\Delta iK_M$ flows into the emitter region $E_3$, the current $iK_3$ becomes zero at a time point t3 so long as the region $E_3$ is not thermally broken down. The $t_f$ designates a called fall period. Between times $t2_b$ and t3, the emitter region $E_3$ solely receives the whole anode currents, so that the anode current Ia gently decreases, as shown in the figure. Accordingly, the increase of the anode-cathode voltage is gentle during the period between the time point $t2_b$ and time point t3. Immediately after the time point t3 that the current $iK_3$ is reduced perfectly zero, the displacement current $i_d$ flowing into the junction capacity Cj also becomes small. As a result, the increment $\Delta$Ia of the anode current based on the displacement current $i_d$ also becomes small. As seen from the above, the amount of change $\Delta$Ia has a relation with the shares of the anode currents in the respective emitter regions of the GTO thyristor. The decrease of the $\Delta$Ia indicates that there is a concentration of the anode current into a specific emitter region. The excessive concentration of the anode current breaks down the GTO thyristor. By detecting the index Ma, it is possible to know the maximum turn-off anode current or whether or not the GTO thyristor is operated at a critical point to the breakdown.

Figure 15:
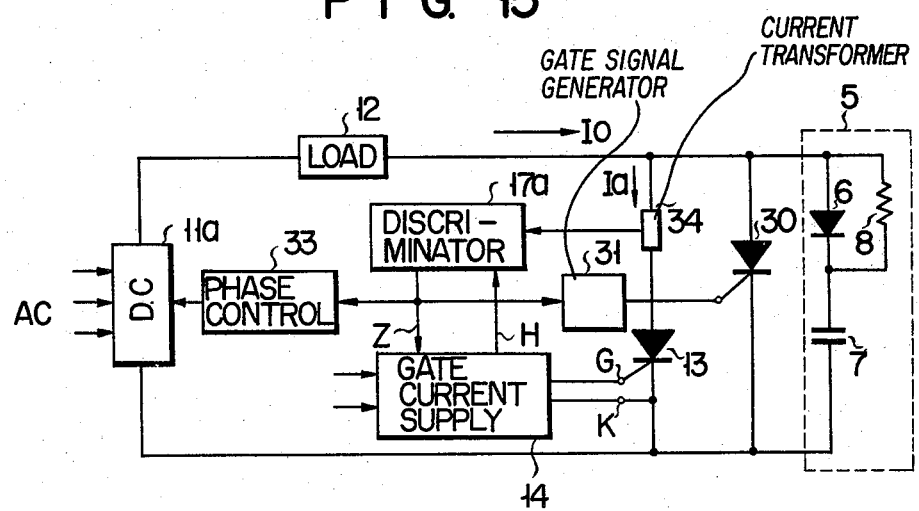
FIG. 15 shows in block and schematic circuit forms a modification of the embodiment shown in FIG. 8.

The second embodiment of FIG. 8 may be modified to the one shown in FIG. 15. While the example shown in FIG. 7 obtains the index M (=$\Delta$Va/Va(t3)), the modification shown in FIG. 15 obtains the index Ma (=$\Delta$Ia/Ia(t0)). The remaining portions in FIG. 8 will not be explained by using like reference symbols for the like or equivalent portions in the related figure.

What we claim is:

1. A protection device for a gate turn-off (GTO) thyristor included in a thyristor control circuit which comprises a DC source, a load and a Snubber circuit connected in series, said GTO thyristor being connected through a current transformer to a positive terminal of said Snubber circuit at the anode, to a negative terminal of said Snubber circuit at the cathode and, between the gate and cathode being supplied a positive gate current and a negative gate current from a gate current supply circuit for turning on and off said GTO thyristor, and said GTO thyristor being operated in such a manner that the supply of said negative gate current is commenced at a first time point, a current passage in a region between said anode and cathode is shrinked from said first time point to a second time point, the anode current of said GTO thyristor is decreased from said second time point to a third time point, the anode current is increased from said third time point to a fourth time point at which a transient voltage developed by an inductance in said Snubber circuit is reduced to substantially zero, and said anode current is decreased again from said fourth time point, wherein said protection device comprises said current transformer and a discriminating circuit, said discriminating circuit comprising:

means for receiving an anode current signal from said current transformer and a timing signal supplied from said gate current supply circuit at said first time point, means for obtaining a changed amount of said anode current between said third and fourth time points, means for obtaining a ratio of said changed amount to an anode current in the vicinity of said first time point including said first time point, means for comparing said ratio with a reference value to produce a control signal when said ratio is smaller than said reference value, and means for supplying said control signal to said gate current supply circuit, thereby stopping the supply of said positive gate current to said GTO thyristor.

2. A protecting circuit according to claim 1, wherein said GTO thyristor is connected through a load and a detector for the anode current of said GTO thyristor to a DC power source, a Snubber circuit is connected in parallel with a series circuit having said GTO thyristor and said current detector, an output current from said current detector is fed to said discriminating circuit.

3. A protecting device according to claim 1, wherein said GTO thyristor is connected through a load and detector for detecting an anode current of said GTO thyristor to a DC power source including first thyristors, a series circuit having said GTO thyristor and said current detector is connected in parallel with a Snubber circuit and a second thyristor with the same polarity as that of said GTO thyristor, said discriminating circuit receives an output current of said anode current detector and supplies said control signal through a gate signal generating circuit to the gate of said second thyristor to render said second thyristor conductive, while at the same time supplies said control signal through a phase control circuit to the gates of said first thyristors thereby to reduce an output voltage of said DC power source to substantially zero.

4. A protection device for a gate turn-off thyristor in a thyristor control circuit which comprises a DC source, a load and a Snubber circuit connected in series, said GTO thyristor being connected to a positive terminal of said Snubber circuit at the anode, to a negative terminal of said Snubber circuit at the cathode and, between the gate and cathode being supplied a positive gate current and a negative gate current from a gate current supply circuit for turning on and off said GTO thyristor, and said GTO thyristor being operated in such a manner that the supply of said negative gate current is commenced at a first time point, a current passage in a region between said anode and cathode is shrinked from said fist time point to a second time point, the anode-cathode voltage of said GTO thyristor is increased from said second time point to a third time point, the anode-cathode voltage is decreased from said third time point to a fourth time point at which a transient voltage developed by an inductance in said Snubber circuit is reduced to substantially zero, and said anode-cathode voltage is increased again from said fourth time point; wherein said protection device comprises a voltage dividing circuit connected in parallel with said Snubber circuit and a discriminating circuit, said discriminating circuit comprising:

means for receiving an anode-cathode voltage signal from a voltage dividing node of said voltage dividing circuit and a timing signal supplied from said gate current supply circuit at said first time point, means for obtaining a changed amount of said anode-cathode voltage between said third and fourth time points, means for obtaining a ratio of said changed amount to a anode-cathode voltage at said third time points, means for comparing said ratio with a reference value preset to produce a control signal when said ratio is smaller than said reference value, and means for supplying said control signal to said gate current supply circuit, thereby stopping the supply of said positive gate current to said GTO thyristor.

5. A protecting device according to claim 4, wherein said GTO thyristor is connected to a DC power source through a load, a voltage-divider and a Snubber circuit are connected in parallel with said GTO thyristor, and a voltage derived from a voltage dividing point of said voltage-divider is applied to said discriminating circuit.

6. A protecting device according to claim 4, wherein said GTO thyristor is connected through a load to a DC power source including first thyristors, and is connected in parallel with a voltage-divider, a Snubber circuit, and a second thyristor with the same polarity as that of said GTO thyristor, and said discriminating circuit receives a voltage derived from a voltage dividing point of said voltage-divider and applies said control signal through a gate signal generating circuit to the gate of said second thyristor thereby to turn on said second thyristor, while at the same time applies said control signal through a phase control circuit to the gates of said first thyristors thereby to reduce the output voltage of said DC power source to substantially zero.

7. A protection device according to claims 1 or 4 wherein said DC source is a rectifier comprised of first thyristors for rectifying an AC voltage to obtain a DC voltage and said protection device further comprises a second thyristor connected in parallel with said Snubber circuit with its anode connected to the positive terminal of said Snubber circuit, a gate signal generating circuit which when it receives said control signal from said discriminating circuit renders said second thyristor conductive, and a phase control circuit which when it receives said control signal from said discriminating circuit causes the output voltage of said rectifier to be reduced to substantially zero by controlling said first thyristors.

8. A protecting device according to claims 1 or 4, wherein said protecting circuit includes output terminals connected to the gate of the cathode of said GTO thyristor, respectively, an ON signal for feeding said positive current to said gate and on OFF signal for feeding said negative current to said gate are supplied to the input terminals of said protecting circuit, respectively, and when said discriminating circuit supplies said control signal to said protecting circuit, the supply of said ON and OFF signals is stopped.

* * * * *